(12) United States Patent
Bosco et al.

(10) Patent No.: US 6,504,208 B2
(45) Date of Patent: Jan. 7, 2003

(54) POWER MOSFET DEVICE, STRUCTURES EMPLOYING THE SAME AND METHODS OF FABRICATION

(75) Inventors: Frank E. Bosco, Poughkeepsie, NY (US); George T. Galyon, Fishkill, NY (US); Steven J. Mazzuca, New Paltz, NY (US); Prabjit Singh, Poughkeepsie, NY (US)

(73) Assignee: International Business Machines Corporation, Armon, NY (US)

( * ) Notice: Subject to any disclaimer, the term of this patent is extended or adjusted under 35 U.S.C. 154(b) by 2 days.

(21) Appl. No.: 09/794,937

(22) Filed: Feb. 27, 2001

(65) Prior Publication Data

US 2002/0117716 A1 Aug. 29, 2002

(51) Int. Cl.⁷ .............................................. H01L 29/76
(52) U.S. Cl. ...................................... 257/341; 257/337
(58) Field of Search ................................ 257/341, 337, 257/355, 368, 401

(56) References Cited

U.S. PATENT DOCUMENTS

| | | | |
|---|---|---|---|
| 5,164,802 A | 11/1992 | Jones et al. | 257/337 |
| 5,696,396 A | 12/1997 | Tokura et al. | 257/341 |
| 5,990,518 A | 11/1999 | Kobayashi et al. | 257/341 |

*Primary Examiner*—Mark V. Prenty
(74) *Attorney, Agent, or Firm*—Floyd A. Gonzalez, Esq.; Kevin P. Radigan, Esq.; Heslin Rothenberg Farley & Mesiti P.C.

(57) ABSTRACT

A semiconductor device, full bridge converter employing the same, and methods of fabrication thereof are provided. The device includes a vertical MOSFET having a parasitic body diode at a junction face between a body region and a semiconductor layer thereof. The parasitic body diode is suppressed by having no direct electrical connection to the body region, resulting in the parasitic body diode being open-circuited within the MOSFET. Co-packaged with the MOSFET is a separate bypass diode connected across a source and a drain of the MOSFET. The bypass diode functions to clamp the voltage across the MOSFET without employing the parasitic, electrically isolated body diode of the MOSFET.

25 Claims, 7 Drawing Sheets fig. 1
(PRIOR ART)

POWER MOSFET DEVICE, STRUCTURES EMPLOYING THE SAME AND METHODS OF FABRICATION

TECHNICAL FIELD

The present invention relates generally to semiconductor devices, and more particularly, to a semiconductor device having a vertical MOSFET (metal oxide-semiconductor field-effect transistor) structure.

BACKGROUND OF THE INVENTION

Various MOSFET structures are known from the background literature in the art. For example, reference U.S. Pat. Nos. 5,990,518; 5,696,396; and 5,164,802, each of which is hereby incorporated herein by reference in its entirety.

Figure 1:
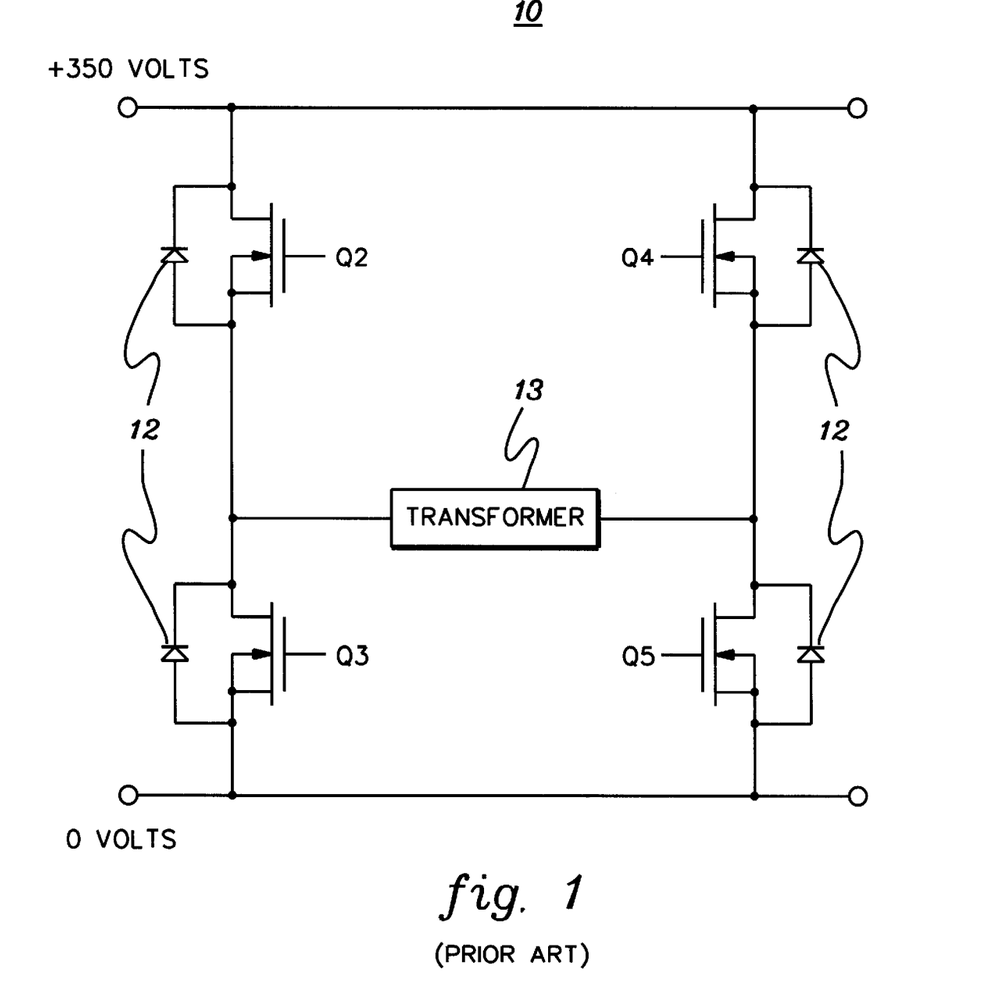
FIG. 1 is a schematic of a prior art full bridge converter circuit employing body diodes internal to the transistors Q2, Q3, Q4 & Q5.

In a conventional implementation, a power MOSFET includes a parasitic body diode which functions as a clamp on the voltage across the transistor. This can be seen from the schematic of FIG. 1 wherein a full bridge (H-bridge) converter, generally denoted 10, is shown. Such converters are utilized for high efficiency, high power (e.g., 500 watts and up) converter assemblies that require very high packaging densities due to space constraints. In FIG. 1, each power MOSFET has an internal body diode 12, which as noted above is utilized as a clamp on the voltage across the transistor, and a transformer 13 whose secondary may be either a current doubler rectifier or a standard rectifier.

The most significant failure mode for a full bridge converter such as depicted in FIG. 1 is one of the power MOSFETs Q2, Q3, Q4 and Q5 failing.

Figure 2:
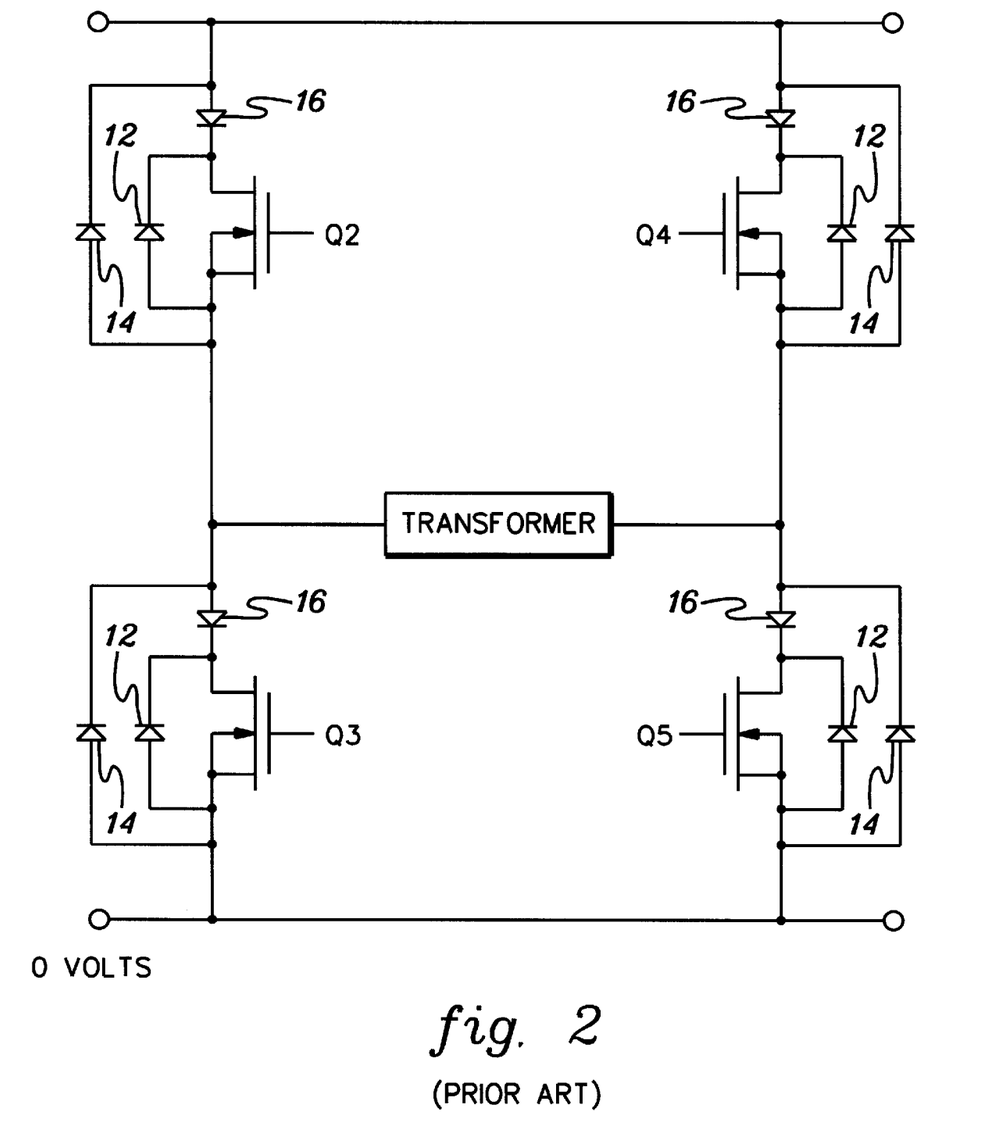
FIG. 2 is a schematic of an alternate embodiment of a full bridge converter circuit employing bypass and blocking diodes to enhance MOSFET reliability.

A standard method of preventing MOSFET failure is to use a set of "blocking and bypass" diodes to control the internal body diode of the MOSFET and replace its function. FIG. 2 depicts one example of a full bridge converter connected with bypass diodes 14 and blocking diodes 16. Unfortunately, there are various difficulties with this solution. For example, the need to package 8 diodes of relatively high current carrying capability is costly and space consuming. Further, the need for the blocking diodes to carry very high current loads requires considerable heat sinking, which adds to the cost and space consumption of the converter.

DISCLOSURE OF THE INVENTION

In view of the above, an enhanced MOSFET circuit is believed commercially desirable. Presented herein is one solution wherein the internal body diode is suppressed by electrical isolation thereof, which thereby allows the MOSFET structure to be optimized for reliability without effecting performance.

Briefly summarized, the present invention comprises in one aspect a MOS device which includes a semiconductor layer of a first conductivity type and a body region of a second conductivity type. The semiconductor layer has a major surface and the body region is formed from a portion of the major surface. The body region has a surface plane and a junction face. The junction face of the body region adjoins the semiconductor layer of the first conductivity type. The device further includes a source region of the first conductivity type. The source region is formed from the surface plane of the body region so that the body region is exposed at the surface plane around a perimeter of the source region and the source region is exposed at the surface plane and substantially fills a central portion of the body region. An insulating film is disposed over the portion of the body region extending between the source region and the semiconductor layer and a gate electrode is disposed on the insulating film. A conductive layer electrically contacts the source region without directly electrically contacting the body region so that the parasitic body diode at the junction face between the body region and the semiconductor layer is substantially open-circuited.

In another aspect, a semiconductor device is presented which includes a MOSFET and a bypass diode. The MOSFET has a parasitic body diode at a junction face between a body region and a semiconductor layer thereof. The MOSFET has no direct electrical connection to the body region, so that the body diode is substantially open-circuited within the MOSFET. The bypass diode, which is connected across a source and drain of the MOSFET, functions to clamp the voltage across the MOSFET without employing the parasitic, electrically isolated body diode of the MOSFET.

In a further aspect, the present invention comprises a full bridge converter which includes multiple MOSFET and diode structures connected in a H-bridge configuration. Each MOSFET and diode structure has an open-circuited body diode at a junction face between a body region and a semiconductor layer thereof. The internal body diode is open-circuited due to there being no direct electrical connection to the body region. Further, each MOSFET and diode structure includes a co-packaged bypass diode connected across the source and drain of the MOSFET. The bypass diode functions to clamp voltage across the MOSFET without employing the electrically isolated internal body diode thereof.

Methods of fabrication of the above-described semiconductor structures are also presented and claimed herein.

To restate, a MOS device and semiconductor structures employing the same are disclosed wherein the conventional internal body diode of the MOSFET is suppressed by electrical isolation thereof. By modifying the conventional power MOSFET structure and utilizing bypass diodes, for example, in a full bridge (i.e., H-bridge) converter design, it is possible to eliminate the body diode failure mechanism of the power MOSFET. In addition, the concepts disclosed herein allow a MOSFET designer to enhance significantly either chip capacitances and/or on resistance of the MOSFETs (Rds). The elimination of the MOSFET body diode structure allows a full bridge converter to be operated without the necessity of blocking diodes in addition to the bypass diodes. The increased componentry (i.e., co-packaging of 4 bypass diodes) is justified by the improved reliability obtained by the elimination of the internal body diode of the power MOSFET and its associated failure mechanisms. Additionally, the decreased parasitic capacitances of the MOSFET structure disclosed herein permits reductions of switching and Rds (on) losses not otherwise attainable.

Additional features and advantages are realized through the techniques of the present invention. Other embodiments and aspects of the invention are described in detail herein and are considered part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As noted above, the basic power MOSFET structure is well documented in the background literature in the art. Conventionally, a power MOSFET comprises a structure which contains an internal body diode, which is the natural outcome of the fabrication process. This internal body diode is typically utilized in the transistor circuit as a clamping diode on the voltage across the MOSFET. One advantage of the internal body diode is that it would eliminate any need for separate devices to be co-packaged with the MOSFET. The difficulty recognized herein is with the inability to optimize performance and reliability of a conventional power MOSFET having such an internal body diode.

By way of example, there has been a recent effort to implement fast recovery processes where diffusion traps are placed in the MOSFET structure to optimize the internal body diode function. However, these diffusion traps have been found to increase the basic on resistance (Rds) of the MOSFET making the device less capable of handling high current by generating more heat because the resistance is higher. Therefore, applicants have discovered that by making the internal body diode switch generate less heat, the MOSFET itself generates more heat. Thus, because of the integrated nature of the internal body diode and the MOSFET structure, it is difficult to optimize performance of one without degrading performance of the other.

Figure 3:
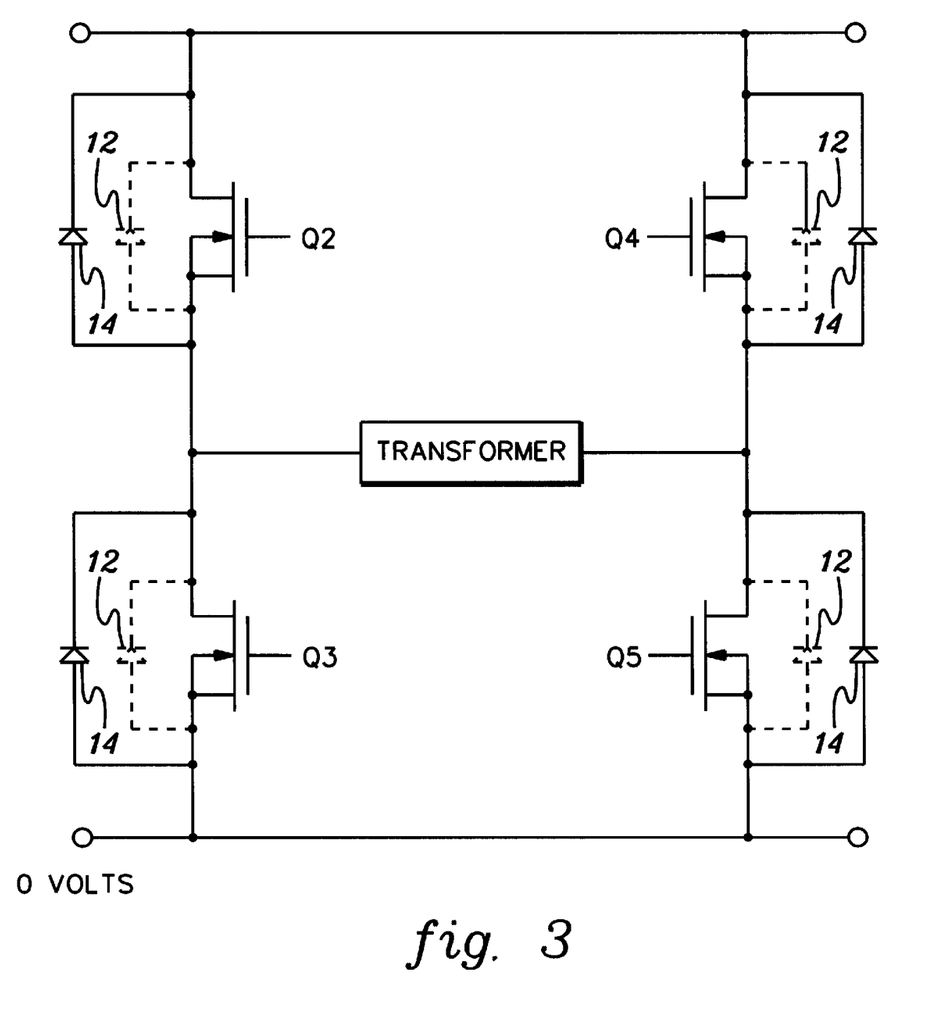
FIG. 3 is a schematic of one embodiment of a full bridge converter circuit in accordance with the principles of the present invention wherein direct connection to the body diode is eliminated and each transistor is co-packaged with a bypass diode.

Generally stated, the solution presented herein is to eliminate or electrically isolate the internal body diode of the conventional MOSFET structure. In addition, a bypass diode is to be connected in parallel with each MOSFET, which should be contrasted with the conventional textbook solution of using both a blocking diode and a bypass diode to control the internal body diode of the MOSFET. A bypass diode as presented herein is a lower current carrying diode than described above in connection with FIG. 2, and does not require the same degree of heat sinking. FIG. 3 is a schematic of a proposed full bridge converter design employing only one external bypass diode 14 in parallel with each MOSFET structure. In FIG. 3, the internal body diode 12 is shown in phantom since the diode is to be suppressed or electrically isolated in accordance with the present invention.

Figure 4A:
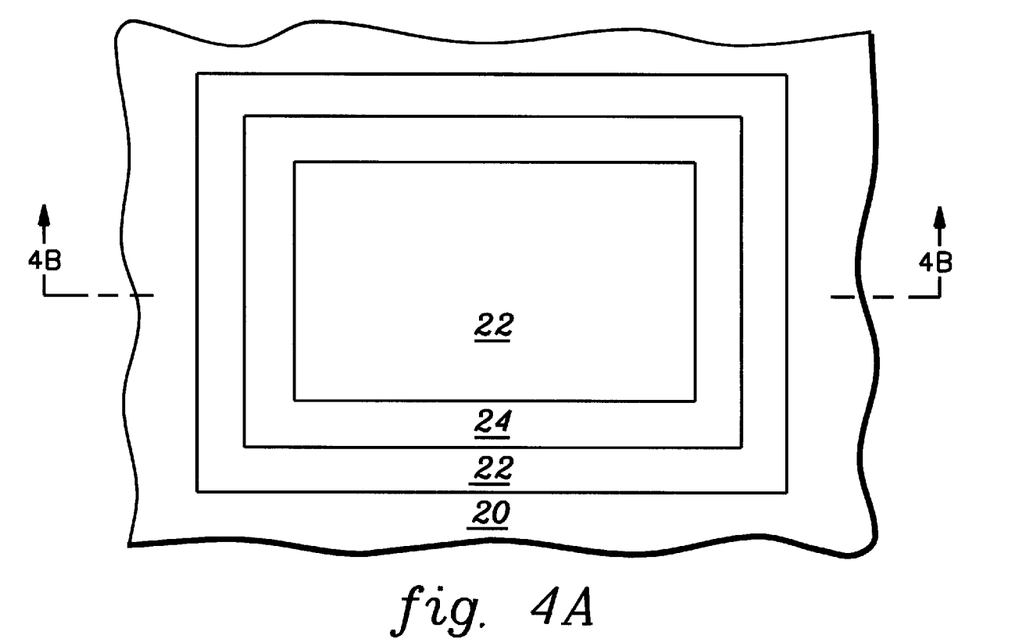
FIG. 4A is a plan view of one embodiment of a conventional MOS device with an internal body diode such as depicted in FIG. 1.
Figure 4B:
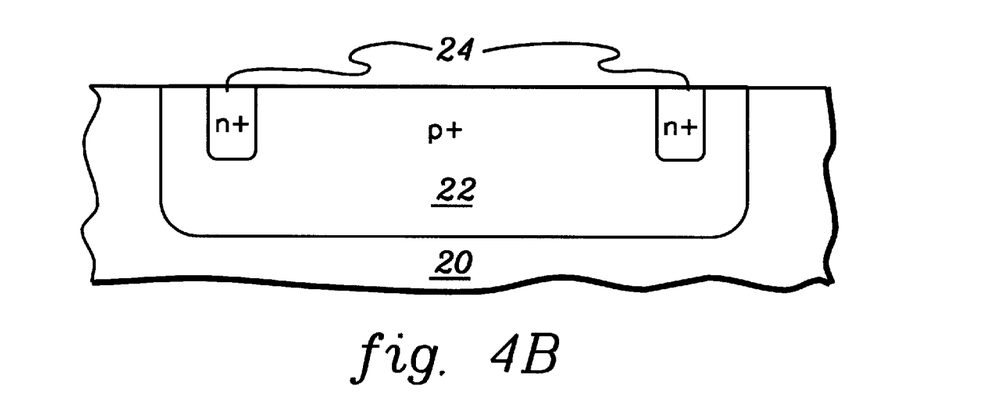
FIG. 4B is a cross-sectional elevational view of the structure of FIG. 4A taken along line 4B—4B.

FIGS. 4A & 4B depict a typical implementation of a power MOSFET device utilized today by all major manufacturers. A body region 22, e.g., p+ type, is formed within a semiconductor layer 20 from a major surface thereof. Within body region 22 a picture frame type source region 24 is defined as shown from a surface plane of the body region 22. This source region comprises, for example, an n+ diffusion. Although not shown, the n+ and p+ regions 24 & 22 would be conventionally connected (shorted) together by an aluminum metalization contact to the transistor. The internal body diode is the p+ n junction defined by the p+ diffusion window of the body region 22 in the semiconductor layer 20, which is assumed to comprise n type material.

As noted, within the p+ diffusion window, a "picture frame" opening in a mask layer (not shown) would define the region for the n+ diffusion which is intended to be the source of the n channel MOSFET. However, the n+ diffusion is also an emitter for the parasitic n+pn− bipolar transistor and it is this parasitic bipolar transistor which is the underlying cause of most, if not all, power MOSFET failures in the full bridge application (depicted in FIGS. 1–2). Minority carriers generated by the normal (and expected) operation of the internal body diode during operation of the full bridge converter will, on occasion, cause the parasitic bipolar to turn "on" (i.e., secondary breakdown) and short out the entire device causing failure due to localized melting of the silicon.

Figure 5A:
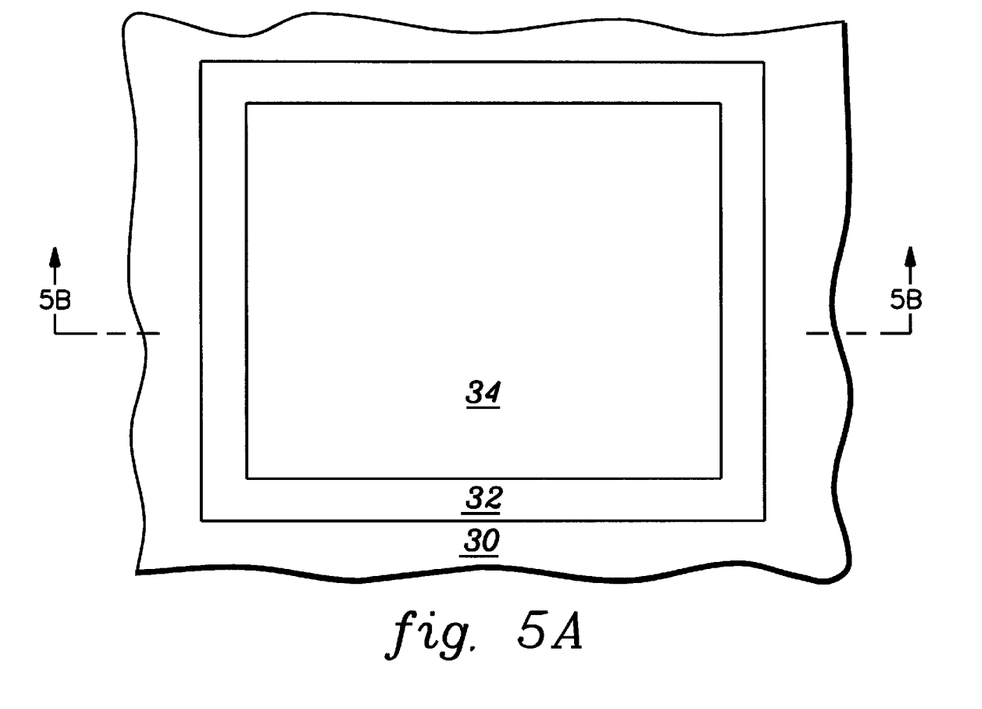
FIG. 5A is a plan view of one embodiment of a MOS device in accordance with the principles of the present invention.
Figure 5B:
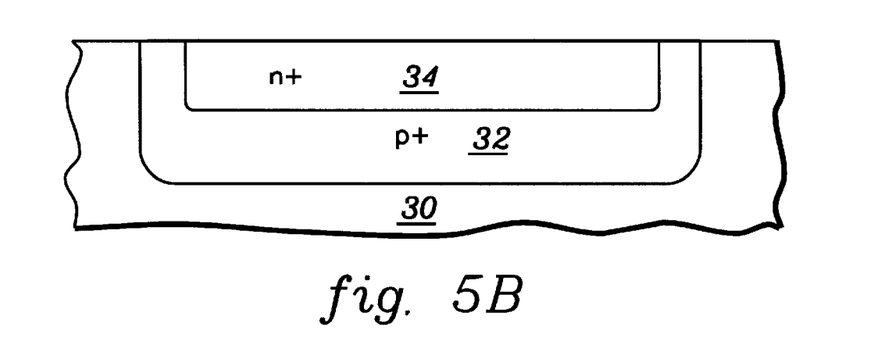
FIG. 5B is a cross-sectional elevational view of the structure of FIG. 5A taken along line 5B—5B.

The present invention proposes in one aspect to essentially "brick in" the n+ diffusion of the source region so as to eliminate the "picture frame" design of FIGS. 4A & 4B. FIGS. 5A & 5B depict one example of an intermediate semiconductor structure obtained during fabrication of a MOSFET in accordance with the principles of the present invention. As shown, a p+ body region 32 is defined within a semiconductor layer 30 (n type) from a major surface thereof. The body region itself includes a surface plane and a junction face. The junction face adjoins the semiconductor layer of the first conductivity type 30. An n+ source region 34 is formed from the surface plane of the body region 32. As shown in FIG. 5A, the source region area at the surface plane is substantially greater than the body region area at the surface plane. In this embodiment, body region 32 is exposed at the surface plane only around a perimeter of the source region 34. Note that although described herein in terms of an npn transistor, the concepts presented are equally applicable to a pnp transistor as would be readily understood by one skilled in the art.

Numerous advantages follow from a semiconductor design such as depicted in FIGS. 5A & 5B. For example, with the elimination or electrical isolation of the internal body diode, it is now possible to significantly reduce the size of today's mini-FET structure. Each power MOSFET chip today is actually made up of hundreds of mini-FETs which are all wired in parallel. This configuration lowers the Rds (on) and the parasitic capacitances in comparison to having one or several large FET structures. Most manufacturers today utilize such a mini-FET design concept. However, in a conventional MOSFET design employing the internal body diode, the mini-FET area is constrained by the need of the body diode to carry relatively large amounts of current, as well as the need of the n+ picture frame area to carry relatively large amounts of current. The elimination of the internal diode decreases the area of requirement of the mini-FET to that area necessary to carry the n+ source current loading only.

With decreased area comes decreased capacitances, which means that the MOSFET structure can be switched faster for a given secondary loading. This is significant because it means that switching losses can be minimized over high loading variations. Typically, as loadings decrease, there is some critical load value for which the switching losses increase significantly. With smaller mini-FETs as proposed herein, and everything else remaining equal, the critical load value decreases which is beneficial. In addition, the increased number of mini-FETs per unit area possible will result in a decrease in the overall Rds value simply due to the effect of connecting more individual Rds resistance paths in parallel.

Figure 6:
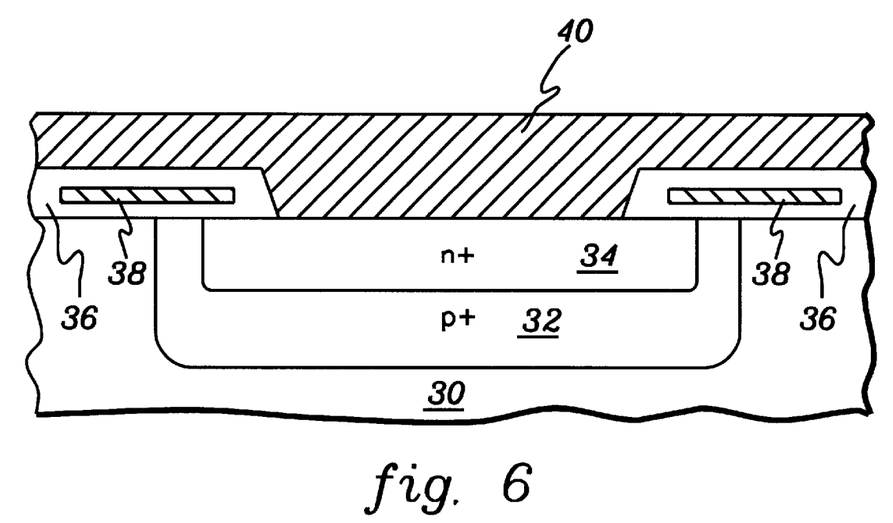
FIG. 6 is a cross-sectional elevational view of the structure of FIG. 5B after insulation film, gate polysilicon and metalization layers have been formed in accordance with the principles of the present invention.

FIG. 6 depicts a cross-sectional elevational view of a completed MOSFET structure in accordance with the present invention. As shown, an insulating film 36 is disposed over the portion of the body region 32 extending between the source region 34 and semiconductor layer 30. A gate electrode 38 is formed on the insulating film 36 and an additional insulating oxide layer 36 is formed over the gate electrode. This insulating layer is patterned and metalization 40 is applied to contact the source region 34. Note that insulating oxide layers 36 function in part to electrically isolate body region 32 from metalization 40, and thereby suppress the internal body diode at the junction face of the body diode and the semiconductor layer 30.

Notwithstanding elimination of the internal body diode, it is still desirable in many instances to couple a diode to the MOSFET structure to act as a clamp. This can be accomplished by use of a separate diode, referred to herein as a bypass diode. However, note that there is no need for a blocking diode as depicted in FIG. 2 once the internal body diode has been eliminated as disclosed herein. The bypass diodes can be standard diodes, however, they will not have to be rated at a current equal to the maximum current rating of the associated MOSFET. Since the bypass diode on the primary will not carry current for any significant portion of the operational cycle, the diode can be derated accordingly. As soon as the MOSFET is conducting, the current load on the bypass diode will be removed. Diode reliability is many orders of magnitude better than that of the power MOSFETs, and it can be expected that by removing the four internal diodes and replacing them with four external bypass diodes, the overall reliability of the resultant structure will be significantly improved due to a reduction in MOSFET related failures.

Figure 7A:
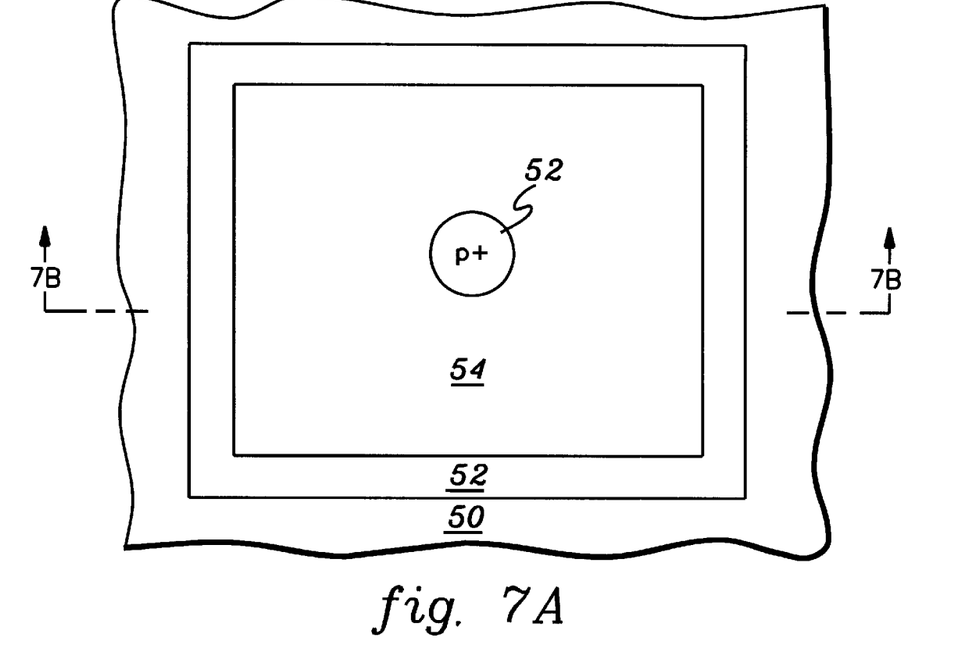
FIG. 7A is a plan view of an alternate embodiment of a MOS device in accordance with the principles of the present invention.
Figure 7B:
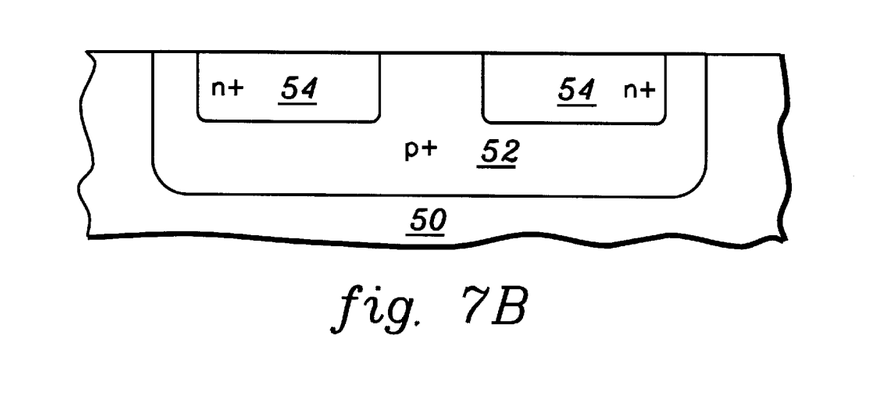
FIG. 7B is a cross-sectional elevational view of the structure of FIG. 7A taken along line 7B—7B.
Figure 8:
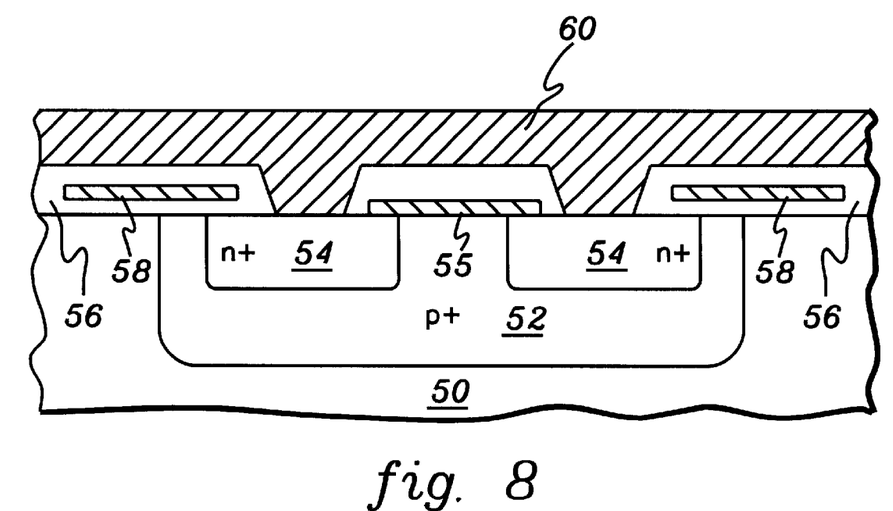
FIG. 8 is a cross-sectional elevational view of the structure of FIG. 7B after formation of gate polysilicon, insulating film and metalization layers in accordance with the principles of the present invention.

One critique of the MOSFET structure of FIGS. 5A–6 is that it is still possible to turn on the parasitic bipolar transistor structure during the gate voltage ramp. During the gate voltage ramp up from the off position to the on position, electrons are drawn to the channel region by the positive voltage ramp of the gate. If this flow of electrons to the gate region is high enough, and the p+ base resistance is high enough, then a forward biasing voltage may be imposed across the n+/p+ junction that can turn the parasitic bipolar transistor on. Without sacrificing too much real estate, it is possible to utilize a design structure such as depicted in FIGS. 7A–8, which employs a "partial brick" n+ diffusion structure with a small p+ region exposed in the center of the n+ brick which comprises the source region. Then, the p+ region and the surrounding n+ brick are shorter together by, for example, a polysilicon or metalization. The end result of this p+/n+ "short" is to essentially eliminate any forward bias from being imposed on the n+/p+ junction.

Referring more particularly to FIGS. 7A–8, in this embodiment of a MOS device, a p+ body region 52 is formed within a semiconductor layer 50 (e.g., an n type semiconductor layer). An n+ source region 54 is then defined within body region 52 from a surface plane of the body region. As shown in FIG. 7A, a small center portion of the source region is left open to expose body region 52. This exposed center region is relatively small compared with the exposed portion of the source region at the surface plane. As shown in FIG. 8, a conductive pad 55, such as polysilicon or a metalization, is disposed over the exposed center body region 52 at the surface plane and electrically connects the p+ body region 52 and the n+ source region 54. An insulating film 56 is disposed over the body region portion extending between the source region and the semiconductor layer and gate electrodes 58 are formed. A conductive layer 60, such as a metalization, then is formed to electrically connect to source region 54 without directly electrically connecting to body region 52. Thus, in this embodiment, the internal body diode is still essentially open-circuited since there is no direct electrical connection to the body region.

There are numerous design advantages to the structures depicted in FIGS. 5A–8. If it is assumed that the n+ picture frame of FIGS. 4A & 4B is one "unit" in width and that the internal body diode structure of a conventional power MOSFET is 4 "units" square, then it is possible to calculate that the area of a mini-FET fabricated in accordance with the present invention may be reduced by almost 50% without effecting the current carrying capability of that mini-FET. If the n+ picture frame of a conventional MOSFET is 1 "unit" in width and the diode is 10 "units" square, then the area of an individual mini-FET fabricated in accordance with the present invention may be reduced by approximately 60%. So the designer may choose to decrease the mini-FET size, keep the same total number of mini-FETs (and, therefore, the same current carrying capability), and reduce the die size by 50–60%. As a result, the chip capacitances will decrease, and the switching speed of the MOSFET will increase. In conjunction with fast recovery diodes employed as the bypass diodes, this combination of devices will create a fast switching H-bridge capable of 0 voltage switching over the widest current loading range. An alternative design approach is to leave the die size the same, and increase the number of mini-FETs by 2 to 2.5. The chip capacitance will stay the same, but the Rds (on) value will decrease by a factor 2 to 2.5. The circuit designer may choose to optimize the zero-voltage switching "range" or Rds "on" power dissipation, or some combination of both.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A MOS device comprising:
   a semiconductor layer of a first conductivity type, said semiconductor layer having a major surface;
   a body region of a second conductivity type formed from a portion of the major surface, said body region having a surface plane and a junction face, said junction face adjoining the semiconductor layer of the first conductivity type;

a source region of said first conductivity type, said source region being formed from said surface plane of said body region, wherein the body region is exposed at the surface plane around a perimeter of the source region and the source region is exposed at the surface plane and substantially fills a central portion of the body region;

an insulating film over the portion of the body region extending between the source region and the semiconductor layer;

a gate electrode on the insulation film; and a conductive layer electrically contacting the source region without directly electrically contacting the body region so that a parasitic body diode defined at the junction face between the body region and semiconductor layer is substantially open circuited.

2. The MOS device of claim 1, wherein the source region completely fills the central portion of the body region at the surface plane, and wherein the body region is exposed at the surface plane only around the perimeter of the source region.

3. The MOS device of claim 2, wherein the body region and the source region each has a planar pattern substantially shaped as a rectangle.

4. The MOS device of claim 1, further comprising an insulation layer which electrically isolates the body region from the conductive layer.

5. The MOS device of claim 1, wherein the body region is exposed at the surface plane within an area of the source region exposed at the surface plane, and the MOS device further comprises a conductive pad over the body region exposed at the surface plane within the source region and at least partially over the source region to short the body region and the source region together, wherein the conductive pad is electrically isolated from the conductive layer contacting the source region.

6. The MOS device of claim 5, wherein an area of the source region exposed at the surface plane is greater than an area of the body region exposed at the surface plane.

7. The MOS device of claim 6, wherein the gate electrode comprises polysilicon, and wherein the conductive pad comprises one of polysilicon or a metal.

8. The MOS device of claim 1, wherein the MOS device comprises a power MOSFET co-packaged with a separate bypass diode, said separate bypass diode being connected between the source region and a drain of the power MOSFET.

9. The MOS device of claim 8, wherein the separate bypass diode comprises a fast recovery diode.

10. The MOS device of claim 1, wherein the first conductivity type is an n-type and the second conductivity type is a p-type.

11. The MOS device of claim 1, wherein the first conductivity type is a p-type and the second conductivity type is an n-type.

12. A semiconductor device comprising:
a MOSFET having a parasitic body diode defined at a junction face between a body region and a semiconductor layer thereof, said MOSFET having no direct electrical connection to the body region, wherein said body diode is substantially open-circuited within said MOSFET; and
a bypass diode connected across a source and a drain of the MOSFET, said bypass diode functioning to clamp a voltage across the MOSFET without employing the parasitic, electrically isolated body diode of the MOSFET.

13. The semiconductor device of claim 12, wherein the MOSFET further comprises a source region formed from a surface plane of the body region, wherein the body region is exposed at the surface plane around a perimeter of the source region and the source region is exposed at the surface plane and substantially fills a central portion of the body region.

14. The semiconductor device of claim 13, wherein the source region completely fills the central portion of the body region at the surface plane, and wherein the body region is exposed at the surface plane only around the perimeter of the source region.

15. The semiconductor device of claim 14, wherein an area of the source region at the surface plane is greater than an area of the body region at the surface plane.

16. The semiconductor device of claim 13, wherein a portion of the body region is exposed at the surface plane within an area of the source region exposed at the surface plane, and the MOSFET further comprises a conductive pad over the body region exposed at the surface plane within the source region and at least partially over the source region to short the body region and the source region together, wherein said MOSFET has no direct electrical connection to the conductive pad.

17. The semiconductor device of claim 16, wherein an area of the source region exposed at the surface plane is greater than an area of the body region exposed at the surface plane.

18. The semiconductor device of claim 12, wherein the bypass diode is separate from the MOSFET, and wherein the MOSFET and the bypass diode are co-packaged.

19. A full bridge converter comprising:
multiple MOSFET and diode structures connected in a H-bridge configuration, each MOSFET and diode structure having:
an open-circuited body diode at a junction face between a body region and a semiconductor layer of the MOSFET, and
a co-packaged bypass diode connected across a source and a drain of the MOSFET, wherein said bypass diode functions to clamp voltage across the MOSFET without employing the open-circuited body diode.

20. The full bridge converter of claim 19, wherein each MOSFET further comprises a source region formed from a surface plane of the body region, wherein the body region is exposed at the surface plane around a perimeter of the source region and the source region is exposed at the surface plane and substantially fills a central portion of the body region.

21. The full bridge converter of claim 20, wherein for each MOSFET the source region completely fills the central portion of the body region at the surface plane, and wherein the body region is exposed at the surface plane only around the perimeter of the source region.

22. The full bridge converter of claim 20, wherein for each MOSFET an area of the source region at the surface plane is greater than an area of the body region at the surface plane.

23. The full bridge converter of claim 20, wherein for each MOSFET a portion of the body region is exposed at the surface plane within an area of the source region exposed at the surface plane, and the MOSFET further comprises a conductive pad over the body region exposed at the surface plane within the source region and at least partially over the source region to short the body region and the source region together, wherein the MOSFET has no direct electrical connection to the conductive pad.

24. A method of fabricating a semiconductor device comprising:

providing a MOSFET having a parasitic body diode at a junction face between a body region and a semiconductor layer thereof;

providing no direct electrical connection to the body region, wherein the parasitic body diode remains open-circuited; and electrically connecting a bypass diode across a source and a drain of the MOSFET, said bypass diode functioning to clamp a voltage across the MOSFET without employing the parasitic, electrically isolated body diode of the MOSFET.

25. A method of fabricating a MOS device comprising:

providing a semiconductor layer of a first conductivity type, said semiconductor layer having a major surface;

forming a body region of a second conductivity type in the semiconductor layer from a portion of the major surface, said body region having a surface plane and a junction face, said junction face adjoining the semiconductor layer of the first conductivity type;

forming a source region of said first conductivity type from said surface plane of said body region, wherein the body region is exposed at the surface plane around a perimeter of the source region and the source region is exposed at the surface plane and substantially fills a central portion of the body region;

disposing an insulating film over the portion of the body region extending between the source region and the semiconductor layer;

providing a gate electrode on the insulating film; and electrically contacting the source region without electrically contacting the body region, wherein without direct electrical connection to the body region, a parasitic body diode at the junction face between the body region and the semiconductor layer remains open-circuited.

* * * * *